(12) United States Patent
Davis et al.

(10) Patent No.: US 9,105,834 B2
(45) Date of Patent: Aug. 11, 2015

(54) PIEZOELECTRIC ACTUATED DEVICE, METHOD AND SYSTEM

(75) Inventors: Wyatt O. Davis, Bothell, WA (US); Utku Baran, Istanbul (TR); Dean R. Brown, Lynnwood, WA (US); Hakan Urey, Istanbul (TR)

(73) Assignee: Microvision, Inc., Redmond, WA (US)

( * ) Notice: Subject to any disclaimer, the term of this patent is extended or adjusted under 35 U.S.C. 154(b) by 838 days.

(21) Appl. No.: 13/360,243

(22) Filed: Jan. 27, 2012

(65) Prior Publication Data

US 2013/0194555 A1 Aug. 1, 2013

(51) Int. Cl.
| | |
|---|---|
| G02B 26/08 | (2006.01) |
| G02B 26/10 | (2006.01) |
| G02B 26/12 | (2006.01) |
| H01L 41/00 | (2013.01) |
| H02N 2/00 | (2006.01) |
| H01L 41/047 | (2006.01) |
| H01L 41/08 | (2006.01) |
| H01L 41/33 | (2013.01) |

(52) U.S. Cl.
CPC .............. *H01L 41/047* (2013.01); *H01L 41/08* (2013.01); *H01L 41/33* (2013.01); *G02B 26/105* (2013.01)

(58) Field of Classification Search
CPC ..... H01L 41/187; H01L 41/18; H01L 41/273; H01L 41/277; H01L 41/27; G02B 26/0858; G02B 26/105; G02B 26/833

USPC .................. 353/94; 359/224.1, 199.4, 200.8; 310/358

See application file for complete search history.

(56) References Cited

U.S. PATENT DOCUMENTS

| | | | | |
|---|---|---|---|---|
| 5,635,629 | A * | 6/1997 | Imai et al. ..................... | 73/35.11 |
| 7,665,852 | B2 * | 2/2010 | Yavid et al. ..................... | 353/85 |
| 2009/0180167 | A1 * | 7/2009 | Tani et al. ................... | 359/198.1 |
| 2009/0185253 | A1 * | 7/2009 | Tani et al. ................... | 359/221.2 |

OTHER PUBLICATIONS

Asai, , "A Novel High Resolution Optical Scanner Actuated by Aerosol Deposited PZT Films", *IEEE 2003* , 247-250.
Iseki, , "High-Speed and Wide-Angle Deflection Optical MEMS Scanner Using Piezoelectric Actuation", *IEEJ Transactions on Electrical and Electronic Engineering* 2010 , 361-368.
Masanao, , "A Two-Axis Piezoelectric Tilting Micromirror with a Newly Developed PZT-Meandering Actuator", *IEEE MEMS* Jan. 21, 2007 , 699-702.
Yasuda, , "A PZT-actuated 2D Optical Scanner for MEMS Image Projection Display", *IDW* 2006 , 1587-1590.
Yasuda, , "Piezoelectric 2D-Optical Micro Scanners with PZT Thick Films", *Integrated Ferroelectrics 80* Jan. 23, 2006 , 341-353.

* cited by examiner

*Primary Examiner* — William C Dowling
*Assistant Examiner* — Ryan Howard
(74) *Attorney, Agent, or Firm* — Kevin D. Wills

(57) ABSTRACT

A piezoelectric actuated device includes one or more areas of piezoelectric material coupled to a substrate. The piezoelectric material may be placed on regions of the substrate that exhibit the greatest curvature and stress when the device is vibrating according to a desired structural Eigenmode of vibration. The piezoelectric material may have a non-uniform density.

9 Claims, 13 Drawing Sheets

PIEZOELECTRIC ACTUATED DEVICE, METHOD AND SYSTEM

FIELD

The present invention relates generally to structural systems, and more specifically to piezoelectric actuated structural systems.

BACKGROUND

Various structural systems have parts that move when actuated. For example, microelectromechanical systems (MEMS) devices may include resonant structures that oscillate when actuated with a forcing function. For any actuator working on a structural system, the forcing function can be decomposed into orthogonal subcomponents that act on the set of all structural Eigenmodes. The amplitudes of each subcomponent describes how well-suited the actuator is to stimulating the corresponding Eigenmode. For resonant systems, the forcing function is used to cause the structural response to be dominated by vibrations corresponding to one Eigenmode.

Piezoelectric unimorphs are common MEMS actuators. An electric field within the piezoelectric film produces a mechanical stress. Attaching the film to another material creates a stress gradient through the composite structure that induces a curvature. FIG. 1 shows a piezoelectric material 110 deposited on a substrate 120. When a voltage is applied to piezoelectric material 110, the resulting stress gradient induces a curvature in substrate 120.

DESCRIPTION OF EMBODIMENT

Figure 1:
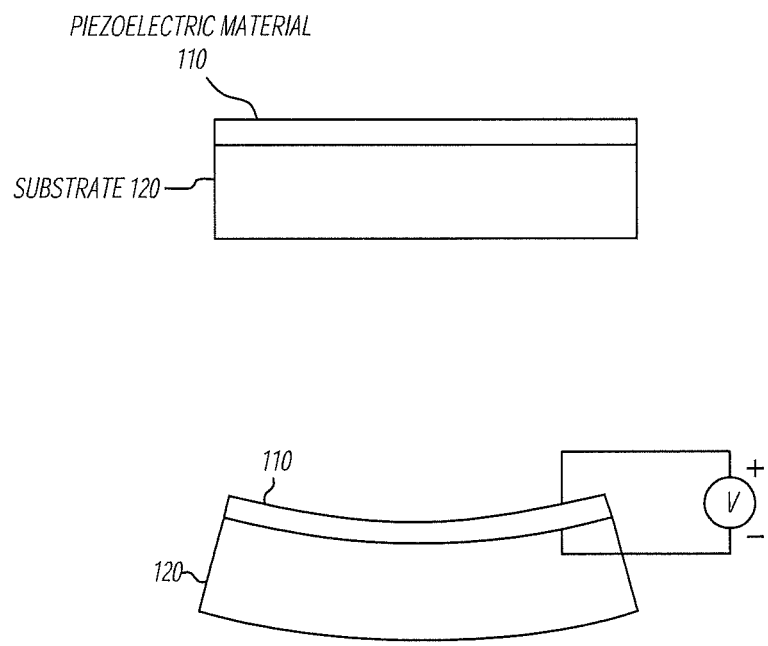
FIG. 1 shows piezoelectric material deposited on a substrate.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Figure 2:
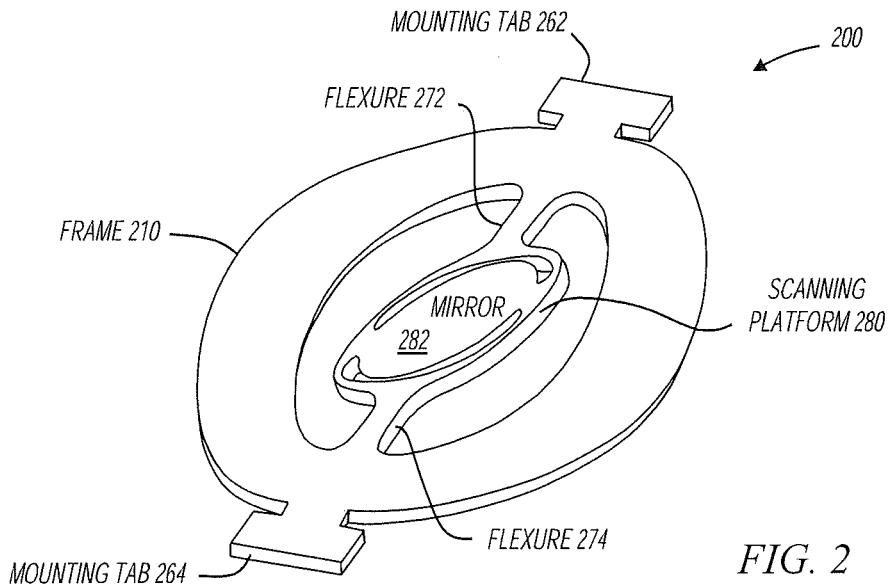
FIG. 2 shows a piezoelectric actuated device with displacements resulting from a desired structural Eigenmode of vibration in accordance with various embodiments of the present invention.

FIG. 2 shows a piezoelectric actuated device with displacements resulting from a desired structural Eigenmode of vibration in accordance with various embodiments of the present invention. Device 200 includes frame 210, mounting tabs 262, 264, scanning platform 280, and scanning mirror 282. Scanning platform 280 is coupled to frame 210 by flexures 272 and 274.

The long axis of flexures 272 and 274 form a pivot axis. Flexures 272 and 274 are flexible members that undergo a torsional flexure, thereby allowing scanning platform 280 to rotate on the pivot axis and have an angular displacement relative to frame 210. Flexures 272 and 274 are not limited to torsional embodiments as shown in FIG. 2. For example, in some embodiments, flexures 272 and 274 take on other shapes such as arcs, "S" shapes, or other serpentine shapes. The term "flexure" as used herein refers to any flexible member coupling a scanning platform to another platform (scanning or fixed), and capable of movement that allows the scanning platform to have an angular displacement with respect to the other platform.

Device 200 is an example of a resonant structure. Flexures 272 and 274 twist, allowing scanning platform 280 to oscillate back and forth at a natural frequency defined by the desired structural Eigenmode of vibration. The desired structural Eigenmode in this example is one in which scanning platform 280 undergoes a large angular displacement relative to frame 210, while frame 210 exhibits little deformation or rotation.

The deformation of device 200 shown in FIG. 2 represents the largest displacements of the frame and scanning platform that result from the desired structural Eigenmode. The left side of frame 210 is shown coming out of the page, and the right side of frame 210 is shown going into the page. Scanning platform 280 is shown having an angular displacement in the opposite direction. During operation, the different sides of the frame alternate going in and out, and the scanning platform oscillates back and forth on the flexures.

When actuated by piezoelectric material (not shown), the frame deformation has a certain two dimensional curvature distribution that imparts a rotation to the ends of the flexures that support the scanning platform. Various embodiments of the present invention pattern piezoelectric material attached to frame 210 to actuate device 200 so that the actuation efficiently promotes the desired Eigenmode and does not promote undesired Eigenmodes. Patterning and densities of actuating piezoelectric material are described further with reference to later figures.

The particular MEMS device embodiment shown in FIG. 1 is provided as an example, and the various embodiments of the invention are not limited to this specific implementation. For example, device 200 includes a mirror that rotates along with scanning platform 280, although this is not a limitation of the present invention. Any structural system (with or without a mirror) may be incorporated. Also for example, device 200 is shown with one scanning platform supported by flexures. In some embodiments, two scanning platforms are utilized, forming a gimbaled structure that allows the inner scanning platform to rotate in two dimensions.

Figure 3:
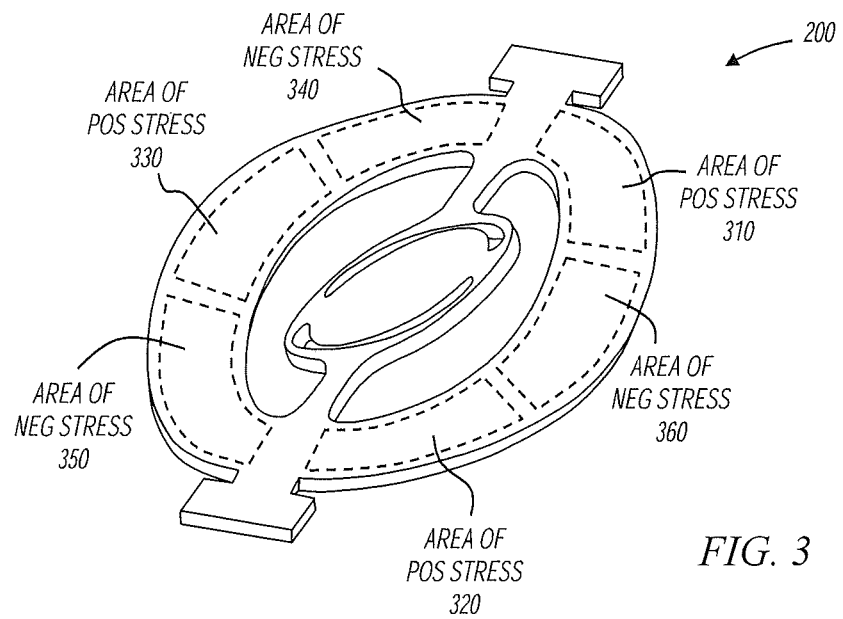
FIG. 3 shows a piezoelectric actuated device with stress resulting from the desired structural Eigenmode of vibration shown in FIG. 2.

FIG. 3 shows a piezoelectric actuated device with stress resulting from the desired structural Eigenmode of vibration shown in FIG. 2. The areas of stress correspond to the distribution of curvature over the structure. For example, areas of positive stress are shown at 310, 320, and 330. These regions of positive stress correspond to a convex curvature. Also for example, areas of negative stress are shown at 340, 350, and 360. These regions of negative stress correspond to a concave curvature. When vibrating according to the desired structural Eigenmode, the areas of positive and negative stress alternate as the curvature alternates between convex and concave.

Various embodiments of the present invention pattern piezoelectric material over areas of greater stress on frame 210 so as to more efficiently couple actuation forces to the displacement field that naturally arises for the desired structural Eigenmode of vibration. Further, in some embodiments, piezoelectric material is patterned with a non-uniform area density, where the density of the piezoelectric material is related to the stress gradient resulting from the curvature distribution.

Figure 4:
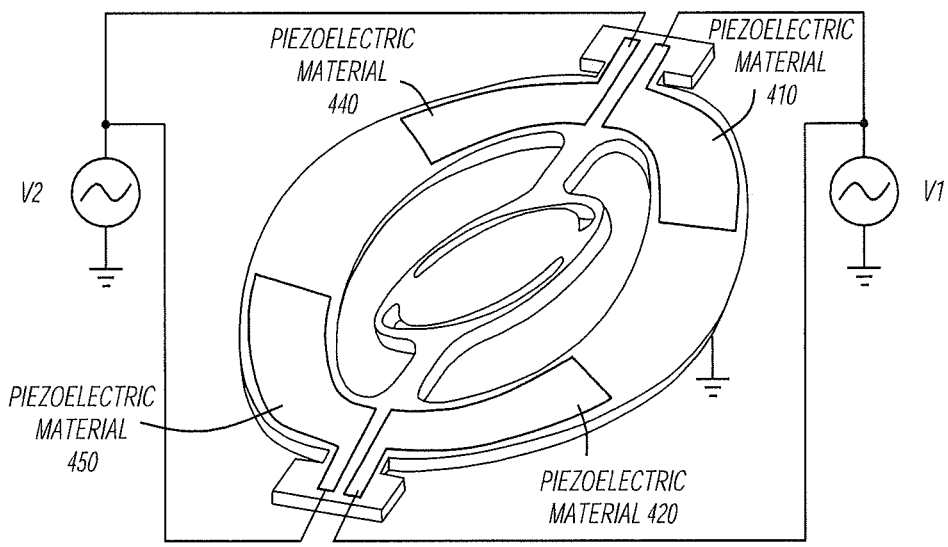
FIGS. 4 and 5 show piezoelectric actuated devices with electrical connections in accordance with various embodiments of the present invention.

FIG. 4 shows a piezoelectric actuated device with electrical connections in accordance with various embodiments of the present invention. Piezoelectric material 410 and 420 are coupled to frame 210 in areas of positive stress, and are electrically coupled in common. Likewise, piezoelectric material 440 and 450 are coupled to frame 210 in areas of negative stress, and are electrically coupled in common. Piezoelectric material 410 and 420 are driven by a forcing function V1, and piezoelectric material 440 and 450 are driven by a forcing function V2.

As shown in FIG. 4, regions of frame 210 where the curvature has positive sign have an attached piezoelectric material with common electrical connections, regions where the curvature has negative sign have an attached piezoelectric material with a different common electrical connection.

The piezoelectric material may be any suitable material and may be coupled to the frame in any fashion. For example, in some embodiments, the piezoelectric material may be a polymer thin film such as Polyvinylidene Fluoride (PVDF), and in other embodiments, the piezoelectric material may be a ceramic material such as Lead Zirconate Titanate (PZT). The material may be manufactured separately and bonded to the frame, or may be chemically deposited on the frame. Any suitable deposition technique may be used, including sputtering, metal organic chemical vapor deposition (MOCVD), pulsed laser deposition (PLD), and chemical solution deposition (CSD). Further, in some embodiments, piezoelectric material may be chemically etched after deposition to modify shapes and/or densities of piezoelectric regions.

In one embodiment, the frame is of silicon having a thickness of approximately 125 microns, and the piezoelectric material is PZT having a thickness of approximately three microns. The total width of the piezoelectric actuated device is approximately 3.75 millimeters, and total length is approximately 7.2 millimeters. The resonant frequency of the desired Eigenmode is 38.4 kHz. The foregoing dimensions are provided as examples, and the various embodiments of the invention are not so limited. For example, in some embodiments, the frame thickness and piezoelectric material thickness are more or less than stated above. Further, in some embodiments, the resonant frequency of the desired Eigenmode is more or less than 38.4 kHz.

As illustrated in FIG. 4, the shape obtained from the piezoelectric material fits with the modal shape of the device at the desired Eigenmode, which enhances the actuation efficiency. The areas of piezoelectric material are mechanically coupled to the frame in areas of greatest stress and curvature, with some areas of piezoelectric material coupled in common electrically.

Figure 5:
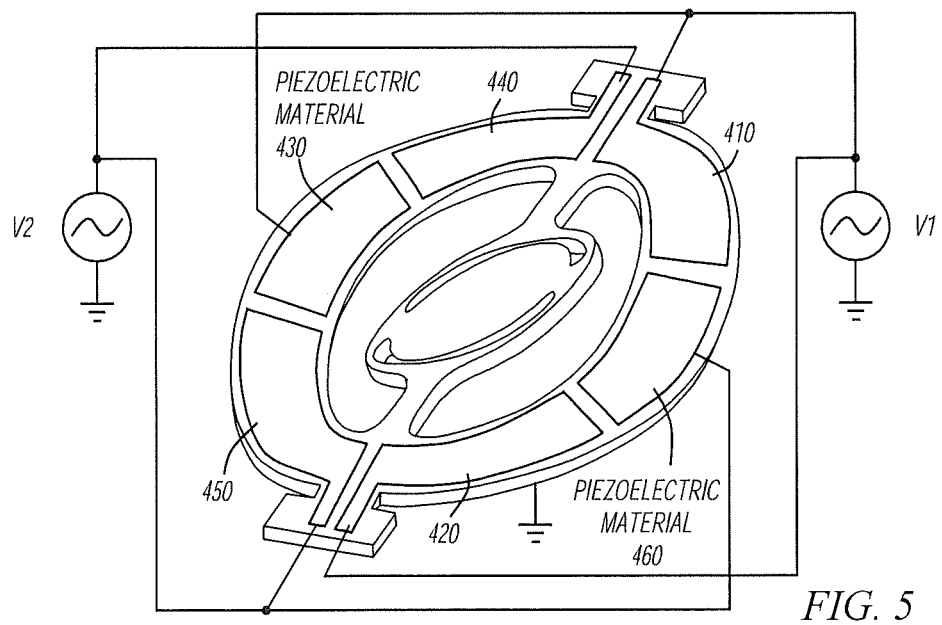

FIG. 5 shows a piezoelectric actuated device with electrical connections in accordance with various embodiments of the present invention. The piezoelectric actuated device shown in FIG. 5 is identical to that shown in FIG. 4 with the addition of piezoelectric material areas 430 and 460. Note that area 430 is in a stress region having the same sign as areas 410 and 420; and area 460 is in a stress region having the same sign as areas 440 and 450. Piezoelectric material areas 410, 420, and 430 are coupled in common electrically, as are piezoelectric material areas 440, 450, and 460.

In the example of FIG. 5, piezoelectric material areas 410, 420, and 430 are driven by forcing function V1, and piezoelectric material areas 440, 450, and 460 are driven by forcing function V2. Forcing functions V1 and V2 may be any type of waveform that produce the desired Eigenmode when driving the piezoelectric material. Examples include, but are not limited to: sine waves, square waves, and impulse functions. In some embodiments, V1 and V2 repeat at the resonant frequency of the desired Eigenmode of vibration. Further, in some embodiments, V1 and V2 have opposite polarities (e.g., sine wave and square wave embodiments).

As shown in FIG. 5, in some embodiments, separate areas of piezoelectric material have alternating signal polarities. For example, on one side of the frame, piezoelectric material areas 410, 460, and 420 have alternating polarities (V1, V2). In some embodiments, more than three areas of piezoelectric material are on one side of the frame. In general, any number of piezoelectric material areas may exist, and their electrical connections may be in common or alternating, or any combination.

Figure 6:
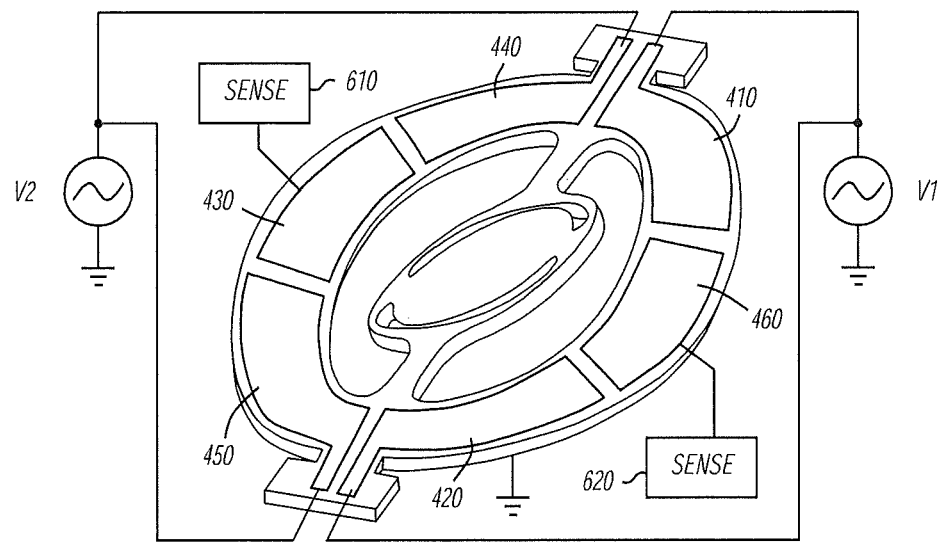
FIG. 6 shows a piezoelectric actuated device with stress sensing circuits in accordance with various embodiments of the present invention.

FIG. 6 shows a piezoelectric actuated device with stress sensing circuits in accordance with various embodiments of the present invention. In the example of FIG. 6, sensing circuit 610 senses a voltage produced by piezoelectric material 430, and sensing circuit 620 senses a voltage produced by piezoelectric material 460. In these embodiments, piezoelectric material areas 410, 420, 440, and 450 are used to actuate the device, and piezoelectric material areas 430 and 460 are used to sense stress in the device.

In some embodiments, piezoelectric material areas are used for both actuating and sensing. For example, time-sequential driving and sensing may be employed if a square wave drive signal is used at lower than 50% duty-cycle. In these embodiments, part of the time can be used for sensing.

In some embodiments, a feedback circuit modifies V1 and V2 in response to the sensing circuits 610 and 620. In other embodiments, the sensing circuits are used during the design phase. Since the sensor output is proportional to the stress, the density and the location of the piezoelectric material can be modified to obtain maximum sensor output. Further, certain regions of the piezoelectric material can be made thinner to achieve large stress in those areas and use those areas for more efficient sensing.

Figure 7:
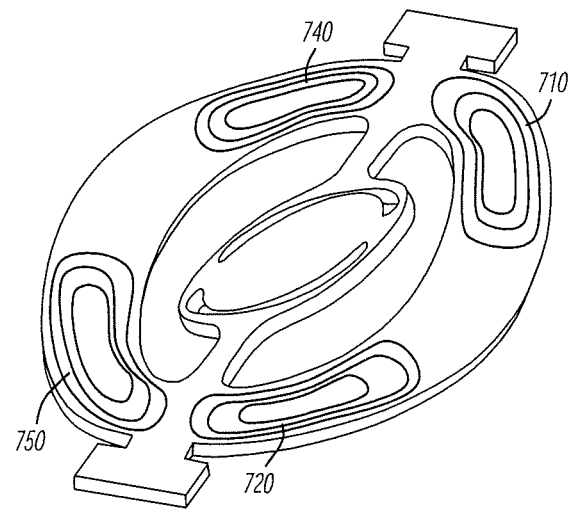
FIG. 7 shows stress contours on a piezoelectric actuated device in accordance with various embodiments of the present invention.

FIG. 7 shows stress contours on a piezoelectric actuated device in accordance with various embodiments of the present invention. Stress contours 710, 720, 740, and 750 show an example of a possible stress gradient that exists in the frame during a structural Eigenmode of vibration. In some embodiments, the location, shape, and/or density of piezoelectric material areas is related to the gradients. For example, in some embodiments, an area density of piezoelectric material is non-uniform and varies in relation to the underlying stress gradient. The term "area density" as used herein refers to mass per unit area. Likewise, the term "non-uniform area density" as used herein refers to a non-uniform mass per unit area.

As described further below, non-uniform area density of piezoelectric material may be accomplished in many ways. Piezoelectric film thickness may be varied, and/or the piezoelectric material may be patterned by selective deposition or etching. Piezoelectric material may be selectively removed so that its area density is proportional to the curvature (or equivalently, surface stress) corresponding to the desired structural Eigenmode of vibration.

In some embodiments, regions of the frame with the highest curvature amplitude (and highest stress) have a piezoelectric material pattern with local maximal density (no pattern), and regions with zero curvature amplitude (and lowest stress) have local minimal piezoelectric material density. In some embodiments, a minimal piezoelectric material density may correspond to a local absence of piezoelectric material if the curvature is very small. Further, regions with intermediate curvature amplitude (and intermediate stress) may have a proportional intermediate local piezoelectric material density created by patterning the material.

In some embodiments, alteration of the density is achieved by changing the size and/or shape of selectively removed portions of the piezoelectric material at the places that the undesired curvature shape appears. In other embodiments, alteration of the density is be achieved by selective removal of a simple shape of a certain size such as a circle, where the pitch of the resulting "hole" is distributed according to the desired density.

A continuous curvature profile can be approximated by a finite number of discrete piezoelectric material densities or by a continuously variable local density.

In so far as the introduction of patterned piezoelectric material changes the structural mode of vibration, the shape of the piezoelectric material area and patterns may be iterated to improve the actuation efficiency.

Figure 8:
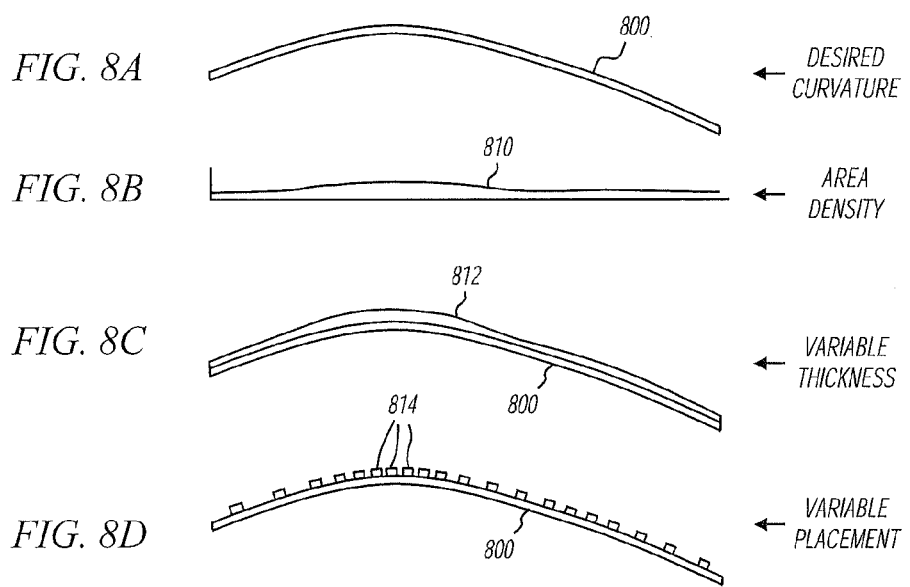
FIG. 8A shows a cross section of a portion of a piezoelectric actuated device with displacements resulting from a desired structural Eigenmode of vibration.
FIG. 8B shows a non-uniform area density function.
FIG. 8C shows the cross section of FIG. 7A with piezoelectric material of varying thickness to produce a non-uniform area density.
FIG. 8D shows the cross section of FIG. 7A with piezoelectric material having been etched to produce a non-uniform area density.

FIG. 8A shows a cross section of a portion of a piezoelectric actuated device with displacements resulting from a desired structural Eigenmode of vibration. Cross section 800 corresponds to a portion of frame 210 (FIG. 2).

FIG. 8B shows a non-uniform area density function. The area density function 810 corresponds to the piezoelectric material density that will result in the curvature shown in FIG. 8A. As can be seen in FIG. 8B, areas of higher piezoelectric material density correspond to regions of higher curvature (and stress) in cross section 800.

FIG. 8C shows the cross section of FIG. 8A with piezoelectric material of varying thickness to produce a non-uniform area density. Piezoelectric material 812 is shown having been applied to cross section 800 according to area density function 810.

FIG. 8D shows the cross section of FIG. 8A with piezoelectric material having been etched to produce a non-uniform area density. The remaining piezoelectric material areas 814 are distributed according to the area density function 810. The piezoelectric material areas 814 are electrically coupled in common so that the curvature as shown has the same sign.

FIGS. 8A-8D show a local one dimensional curvature distribution corresponding to a desires structural Eigenmode of vibration, and a corresponding one dimensional non-uniform piezoelectric material area density function. In some embodiments, the non-uniform piezoelectric material area density function is two dimensional, and the thickness variations and/or material distribution variations are also two dimensional.

Figure 9:
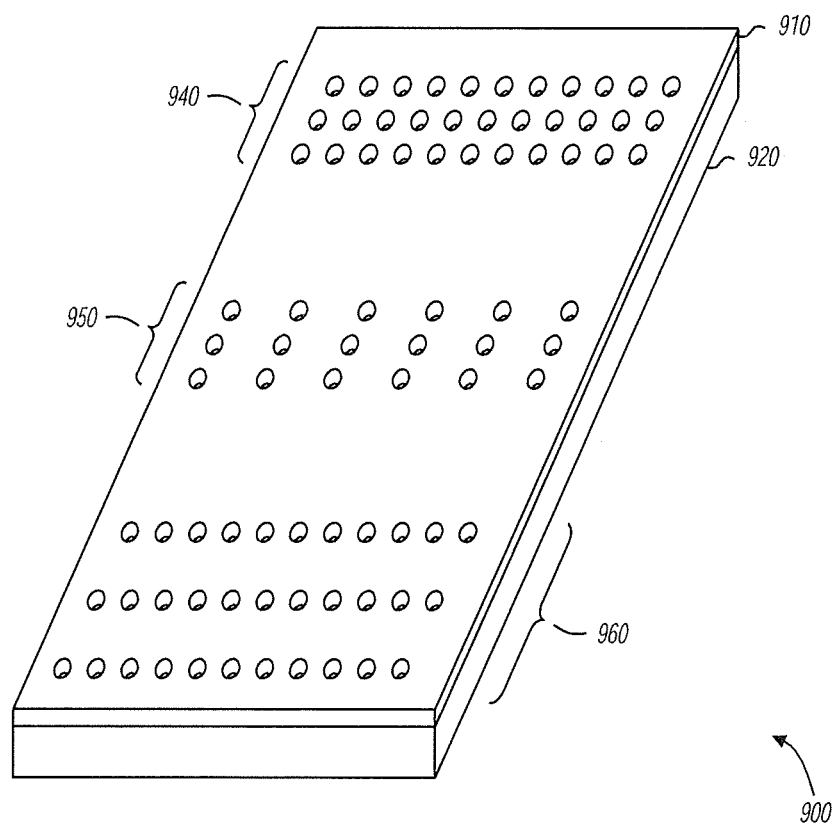
FIG. 9 shows a perspective view of a piezoelectric actuated device with various two-dimensional non-uniform area densities.

FIG. 9 shows a perspective view of a piezoelectric actuated device with various two-dimensional non-uniform area densities. Piezoelectric actuated device 900 includes substrate 920 with piezoelectric material 910. Area 940 shows holes etched in piezoelectric material 910 in a uniform two dimensional distribution.

Area 950 shows holes etched in piezoelectric material 910 to create a greater density on one dimension, while area 960 shows holes etched in piezoelectric material 910 to create a greater density in another dimension.

In general, any two dimensional non-uniform area density may be generated by selectively etching portions of piezoelectric material 910. For example, portions of piezoelectric material 910 may be etched to create a non-uniform area density according to function 810 (FIG. 8) or according to one of stress gradients 710, 720, 740, or 750 (FIG. 7).

Figure 10:
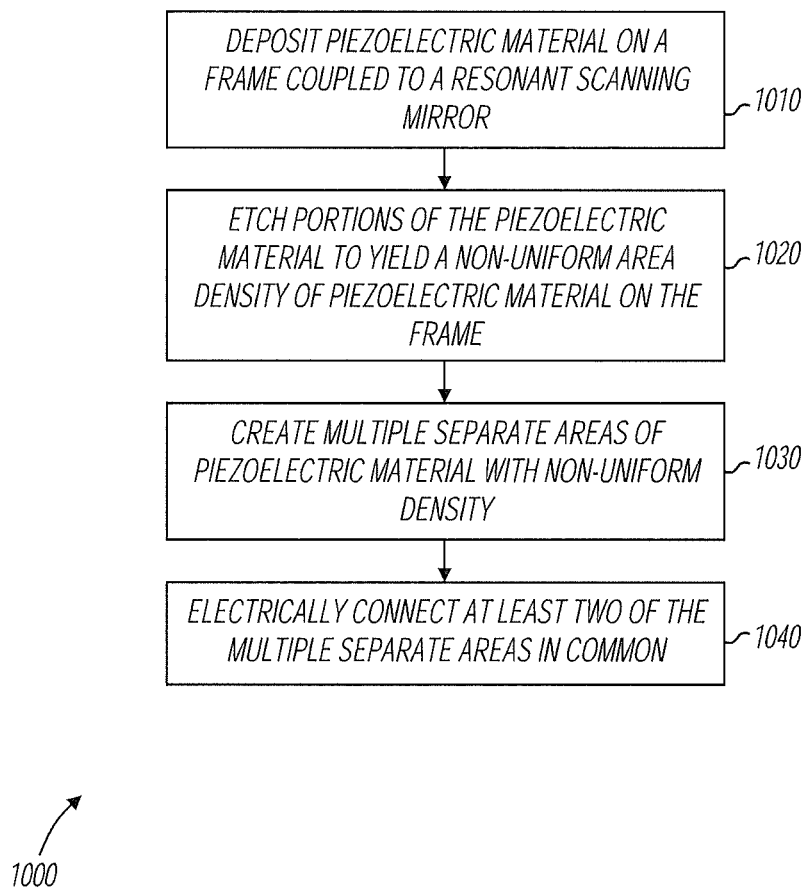
FIGS. 10 and 11 show flow diagrams of methods in accordance with various embodiments of the present invention.

FIG. 10 shows a flow diagram of methods in accordance with various embodiments of the present invention. In some embodiments, method 1000, or portions thereof, is performed to manufacture a piezoelectric actuated device, embodiments of which are shown in previous figures. Method 1000 is not limited by the particular type of apparatus performing the method. The various actions in method 1000 may be performed in the order presented, or may be performed in a different order. Further, in some embodiments, some actions listed in FIG. 10 are omitted from method 1000.

Method 1000 is shown beginning with block 1010. As shown at 1010, piezoelectric material is deposited on a frame coupled to a resonant scanning mirror. The actions of 1010 correspond to depositing any of the piezoelectric material areas shown in previous figures. The deposition may be performed using any deposition technique. Examples are described above.

At 1020, portions of the piezoelectric material is etched to yield a non-uniform area density of piezoelectric material on the frame. In some embodiments, the non-uniform area density corresponds to a stress gradient such that higher densities exist in areas of greater stress. Piezoelectric material may be etched in any shape of combination of shapes. For example, etched portions may be in the shape of circles, rectangles, or any polygon.

At 1030, multiple separate areas of piezoelectric material with non-uniform area densities are created. This corresponds to creating multiple areas such as 410, 420, and 460 (FIG. 5) with non-uniform area densities. At 1040, at least two of the multiple separate areas are electrically connected in common. As an example, this is shown in FIG. 5, in which piezoelectric material areas 410 and 420 are coupled in common.

Figure 11:
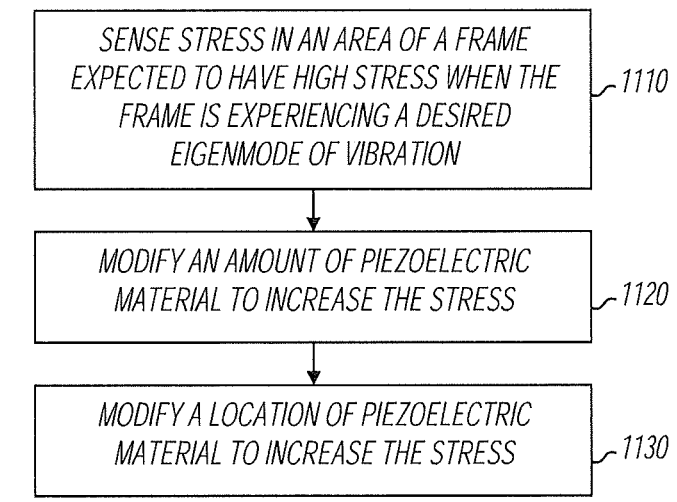

FIG. 11 shows a flow diagram of methods in accordance with various embodiments of the present invention. In some embodiments, method 1100, or portions thereof, is performed to manufacture a piezoelectric actuated device, embodiments of which are shown in previous figures. Method 1100 is not limited by the particular type of apparatus performing the method. The various actions in method 1100 may be performed in the order presented, or may be performed in a different order. Further, in some embodiments, some actions listed in FIG. 11 are omitted from method 1100.

Method 1100 is shown beginning with block 1110. As shown at 1110, stress is sensed in an area of a frame expected to have high stress when the frame is experiencing a desired Eigenmode of vibration. This corresponds to the operation of sensing circuits 610 and 620. At 1120, an amount of piezoelectric material is modified to increase the stress. In some embodiments, this corresponds to modifying the shape of the piezoelectric material, and in other embodiments, this corresponds to etching portions of the piezoelectric material. At 1130, a location of piezoelectric material is modified to increase the stress.

Figure 12:
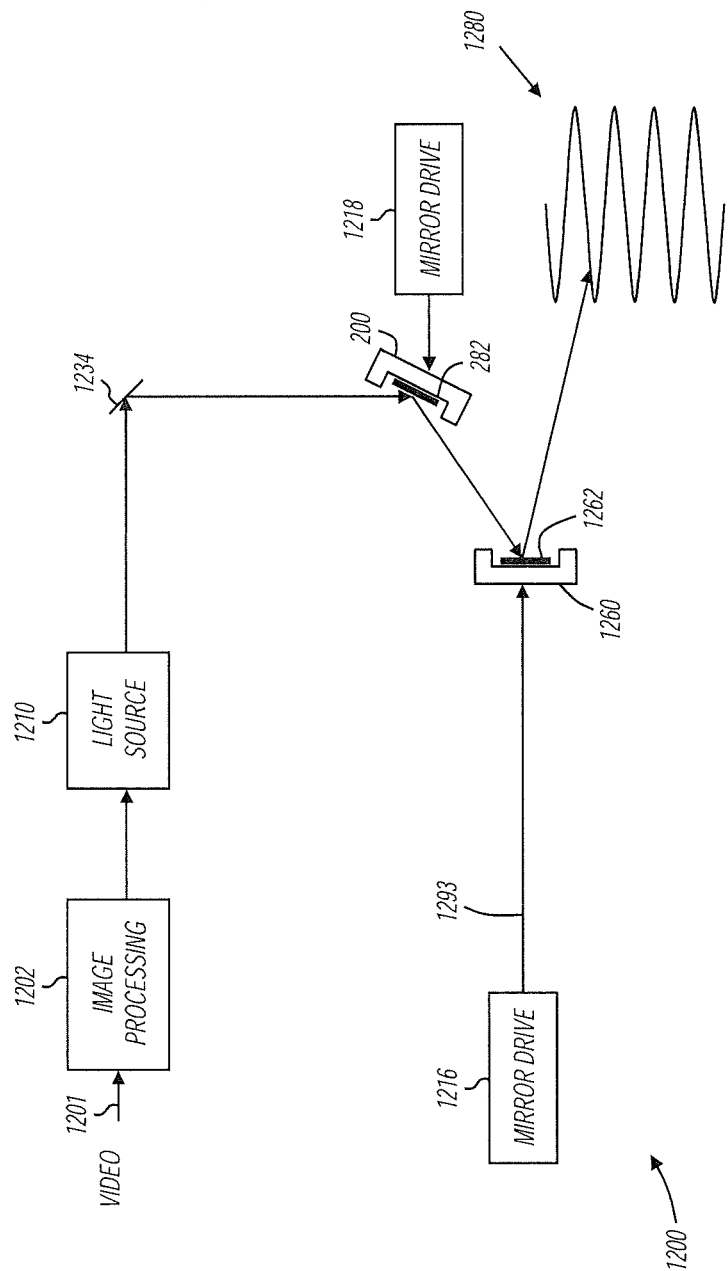
FIGS. 12 and 13 show scanning projectors with piezoelectric actuated devices in accordance with various embodiments of the present invention.

FIG. 12 shows a scanning laser projector in accordance with various embodiments of the present invention. Scanning laser projector 1200 includes image processing component 1202, light source 1210, optical component 1234, piezoelectric actuated device 200 having scanning mirror 282, piezoelectric actuated device 1260 having scanning mirror 1262, and mirror drive circuits 1216 and 1218.

In operation, image processing component 1202 receives video data on node 1201 and produces display pixel data to drive light source 1210 when pixels are to be displayed. The video data on node 1201 represents image source data that is typically received with pixel data on a rectilinear grid, but this is not essential. For example, video data on node 1201 may represent a grid of pixels at any resolution (e.g., 640×480, 848×480, 1920×1080). Laser scanning projector 1200 is a scanning projector that scans a raster pattern shown at 1280. The raster pattern does not necessarily align with the rectilinear grid in the image source data, and image processing component 1202 operates to produce display pixel data that will be displayed at appropriate points on the raster pattern. For example, in some embodiments, image processing component 1202 interpolates vertically and/or horizontally between pixels in the source image data to determine display pixel values along the scan trajectory of the raster pattern.

Light source 1210 receives display pixel data and produces light having grayscale values in response thereto. Light source 1210 may be monochrome or may include multiple different color light sources. For example, in some embodiments, light source 1210 includes red, green, and blue light sources. In these embodiments, image processing component 1202 outputs display pixel data corresponding to each of the red, green, and blue light sources. In some embodiments, light source 1210 may include one or more laser light producing devices. For example, in some embodiments, the light source 1210 may include laser diodes. In these embodiments, light source 1210 also includes driver circuits that accept the display pixel values and produce current signals to drive the laser diodes. The light from light source 1210 is directed to mirror 282 via guiding optics 1234. Any type of optical element may be included in the light path between light source 1210 and mirror 282. For example, scanning laser projector 1200 may include collimating lenses, dichroic mirrors, or any other suitable optical elements.

Piezoelectric actuated device 200 vibrates in a desired Eigenmode of vibration in response to electrical stimuli 1293 from mirror drive 1218, and scanning mirror 282 reflects light provided by light source 110. The reflected light sweeps back and forth on mirror 1262. MEMS device causes mirror 1262 to sweep in response to stimuli 1293 from mirror drive 1216, resulting in a raster pattern and a resultant display at 1280. The shape of the raster pattern at 1280 is a function of the mirror movement of both mirrors 282 and 1262. For example, in some embodiments, scanning mirror 1262 sweeps in a first dimension (e.g., vertical dimension) in response to sawtooth wave stimulus, resulting in a substantially linear and unidirectional vertical sweep. Also for example, in some embodiments, scanning mirror 282 sweeps in a second dimension (e.g., horizontal dimension) according to a sinusoidal trajectory, resulting in a substantially sinusoidal horizontal sweep.

Figure 13:
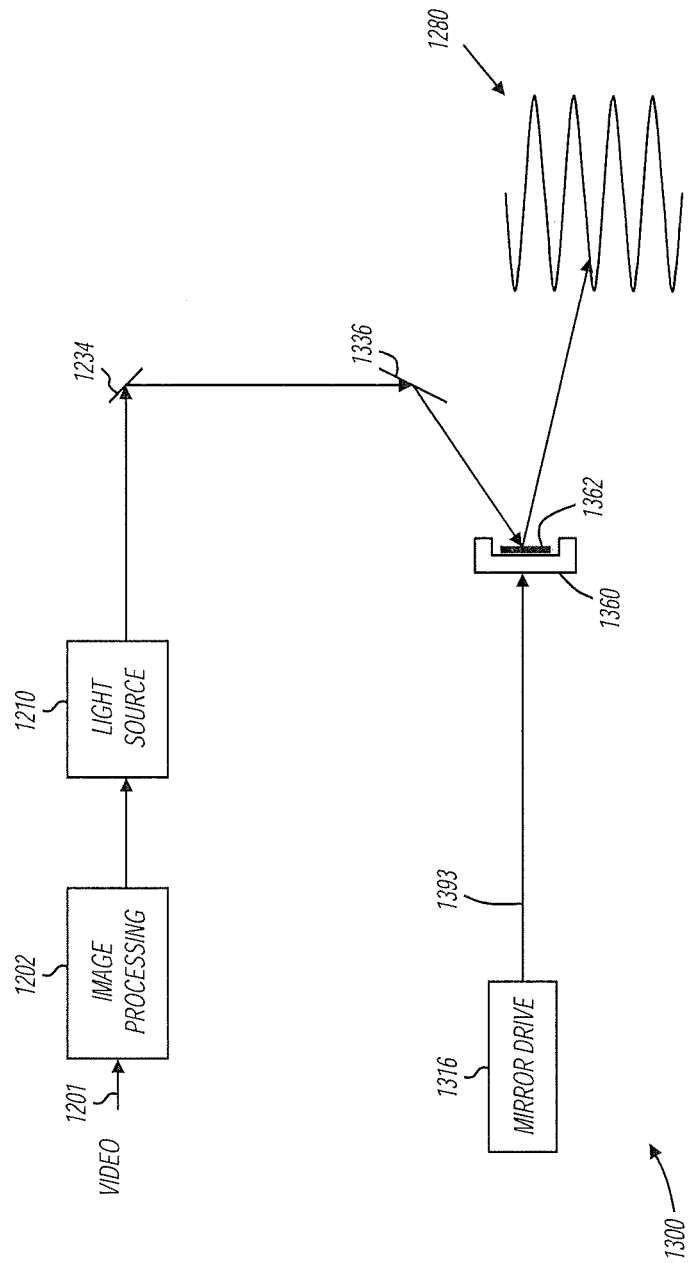

FIG. 13 shows a scanning laser projector in accordance with various embodiments of the present invention. Scanning laser projector 1300 includes image processing component 1202, light source 1210, and optical components 1234 and 1336, all of which are described above with reference to FIG. 12. Scanning laser projector 1300 also includes piezoelectric actuated device 1360 having scanning mirror 1362 and mirror drive circuit 1316.

Piezoelectric actuated device 1360 is an example of a scanning mirror assembly that scans light in two dimensions in response to stimuli 1393. In some embodiments the scanning mirror assembly includes a single mirror that scans in two dimensions (e.g., on two axes). At least one axis is actuated with piezoelectric actuators. In some embodiments, the piezoelectric material is placed to coincide with areas of greatest stress for a desired Eigenmode of vibration as described above. In other embodiments, the piezoelectric material has a non-uniform area density as described above. In still further embodiments, both axes are piezoelectrically actuated.

Figure 14:
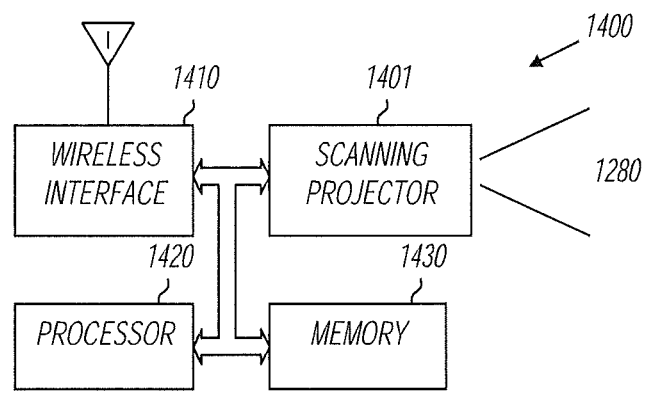
FIG. 14 shows a block diagram of a mobile device in accordance with various embodiments of the present invention.

FIG. 14 shows a block diagram of a mobile device in accordance with various embodiments of the present invention. As shown in FIG. 14, mobile device 1400 includes wireless interface 1410, processor 1420, memory 1430, and scanning projector 1401. Scanning projector 1401 paints a raster image at 1280. Scanning projector 1401 is a scanning laser projector as described above with reference to previous figures. Scanning projector 1401 may include one or more piezoelectric actuated devices as described herein.

Scanning projector 1401 may receive image data from any image source. For example, in some embodiments, scanning projector 1401 includes memory that holds still images. In other embodiments, scanning projector 1401 includes memory that includes video images. In still further embodiments, scanning projector 1401 displays imagery received from external sources such as connectors, wireless interface 1410, a wired interface, or the like.

Wireless interface 1410 may include any wireless transmission and/or reception capabilities. For example, in some embodiments, wireless interface 1410 includes a network interface card (NIC) capable of communicating over a wireless network. Also for example, in some embodiments, wireless interface 1410 may include cellular telephone capabilities. In still further embodiments, wireless interface 1410 may include a global positioning system (GPS) receiver. One skilled in the art will understand that wireless interface 1410 may include any type of wireless communications capability without departing from the scope of the present invention.

Processor 1420 may be any type of processor capable of communicating with the various components in mobile device 1400. For example, processor 1420 may be an embedded processor available from application specific integrated circuit (ASIC) vendors, or may be a commercially available microprocessor. In some embodiments, processor 1420 provides image or video data to scanning projector 1401. The image or video data may be retrieved from wireless interface 1410 or may be derived from data retrieved from wireless interface 1410. For example, through processor 1420, scanning projector 1401 may display images or video received directly from wireless interface 1410. Also for example, processor 1420 may provide overlays to add to images and/or video received from wireless interface 1410, or may alter stored imagery based on data received from wireless interface 1410 (e.g., modifying a map display in GPS embodiments in which wireless interface 1410 provides location coordinates).

Figure 15:
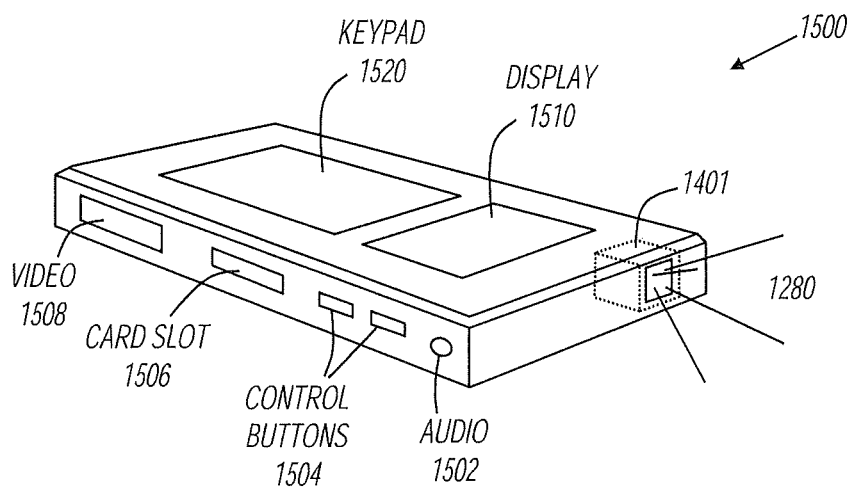
FIG. 15 shows a mobile device in accordance with various embodiments of the present invention.

FIG. 15 shows a mobile device in accordance with various embodiments of the present invention. Mobile device 1500 may be a hand held projection device with or without communications ability. For example, in some embodiments, mobile device 1500 may be a handheld projector with little or no other capabilities. Also for example, in some embodiments, mobile device 1500 may be a device usable for communications, including for example, a cellular phone, a smart phone, a personal digital assistant (PDA), a global positioning system (GPS) receiver, or the like. Further, mobile device 1500 may be connected to a larger network via a wireless (e.g., WiMax) or cellular connection, or this device can accept data messages or video content via an unregulated spectrum (e.g., WiFi) connection.

Mobile device 1500 includes scanning projector 1401 to create an image with light at 1280. Mobile device 1500 also includes many other types of circuitry; however, they are intentionally omitted from FIG. 15 for clarity.

Mobile device 1500 includes display 1510, keypad 1520, audio port 1502, control buttons 1504, card slot 1506, and audio/video (A/V) port 1508. None of these elements are essential. For example, mobile device 1500 may only include scanning projector 1401 without any of display 1510, keypad 1520, audio port 1502, control buttons 1504, card slot 1506, or A/V port 1508. Some embodiments include a subset of these elements. For example, an accessory projector product may include scanning projector 1401, control buttons 1504 and A/V port 1508.

Display 1510 may be any type of display. For example, in some embodiments, display 1510 includes a liquid crystal display (LCD) screen. Display 1510 may always display the same content projected at 1280 or different content. For example, an accessory projector product may always display the same content, whereas a mobile phone embodiment may project one type of content at 1280 while displaying different content on display 1510. Keypad 1520 may be a phone keypad or any other type of keypad.

A/V port 1508 accepts and/or transmits video and/or audio signals. For example, A/V port 1508 may be a digital port such as a high definition media interface (HDMI) port that accepts a cable suitable to carry digital audio and video data. Further, A/V port 1508 may include RCA jacks to accept composite inputs. Still further, A/V port 1508 may include a VGA connector to accept analog video signals. In some embodiments, mobile device 1500 may be tethered to an external signal source through A/V port 1508, and mobile device 1500 may project content accepted through A/V port 1508. In other embodiments, mobile device 1500 may be an originator of content, and A/V port 1508 is used to transmit content to a different device.

Audio port 1502 provides audio signals. For example, in some embodiments, mobile device 1500 is a media player that can store and play audio and video. In these embodiments, the video may be projected at 1280 and the audio may be output at audio port 1502. In other embodiments, mobile device 1500 may be an accessory projector that receives audio and video at A/V port 1508. In these embodiments, mobile device 1500 may project the video content at 1280, and output the audio content at audio port 1502.

Mobile device 1500 also includes card slot 1506. In some embodiments, a memory card inserted in card slot 1506 may provide a source for audio to be output at audio port 1502 and/or video data to be projected at 1280. Card slot 1506 may receive any type of solid state memory device, including for example, Multimedia Memory Cards (MMCs), Memory Stick DUOS, secure digital (SD) memory cards, and Smart Media cards. The foregoing list is meant to be exemplary, and not exhaustive.

Control buttons 1504 may be used for any purpose. For example, in some embodiments, control buttons 1504 may be used to navigate a menu system on display 1510.

Figure 16:
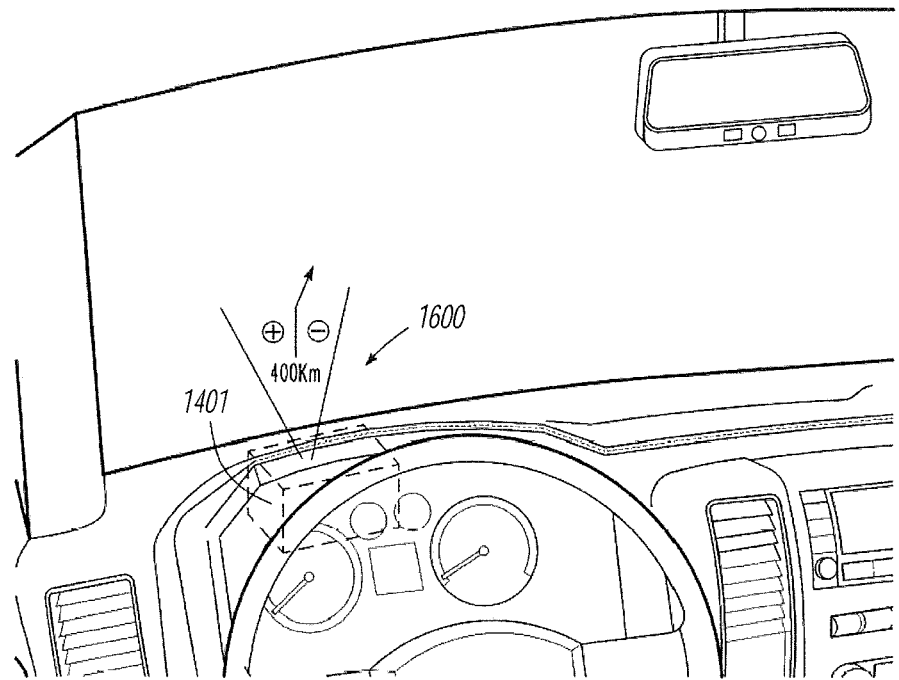
FIG. 16 shows a head-up display system in accordance with various embodiments of the invention.

FIG. 16 shows a head-up display system in accordance with various embodiments of the invention. Projector 1401 is shown mounted in a vehicle dash to project the head-up display at 1600. Although an automotive head-up display is shown in FIG. 16, this is not a limitation of the present invention. For example, various embodiments of the invention include head-up displays in avionics application, air traffic control applications, and other applications.

Figure 17:
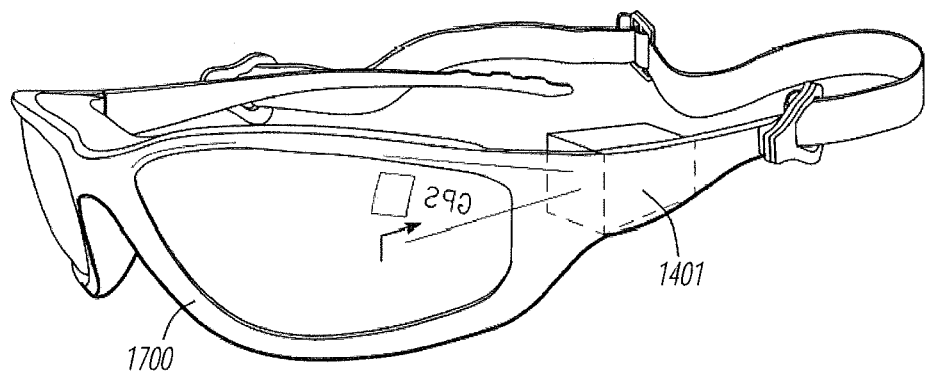
FIG. 17 shows eyewear in accordance with various embodiments of the invention.

FIG. 17 shows eyewear in accordance with various embodiments of the invention. Eyewear 1700 includes projector 1401 to project a display in the eyewear's field of view. In some embodiments, eyewear 1700 is see-through and in other embodiments, eyewear 1700 is opaque. For example, eyewear 1700 may be used in an augmented reality application in which a wearer can see the display from projector 1401 overlaid on the physical world. Also for example, eyewear 1700 may be used in a virtual reality application, in which a wearer's entire view is generated by projector 1401. Although only one projector 1401 is shown in FIG. 17, this is not a limitation of the present invention. For example, in some embodiments, eyewear 1700 includes two projectors; one for each eye.

Figure 18:
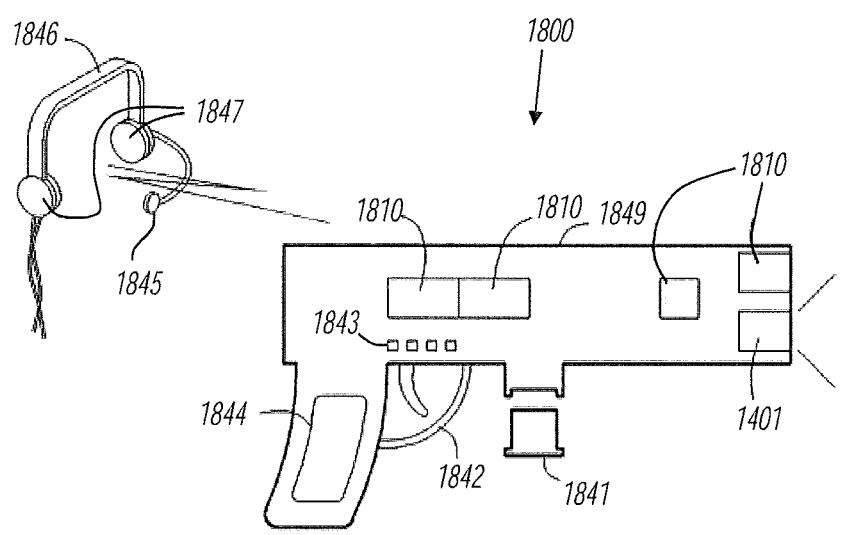
FIG. 18 shows a gaming apparatus in accordance with various embodiments of the present invention.

FIG. 18 shows a gaming apparatus in accordance with various embodiments of the present invention. Gaming apparatus 1800 allows a user or users to observe and interact with a gaming environment. The game is navigated based on the motion, position or orientation of gaming apparatus 1800, an apparatus that includes scanning laser projector 1401. Other control interfaces, such as manually-operated buttons, foot pedals, or verbal commands, may also contribute to navigation around, or interaction with the gaming environment. For example, in some embodiments, trigger 1842 contributes to the illusion that the user or users are in a first person perspective video game environment, commonly known as a "first person shooter game." Because the size, aspect ratio, and brightness of the projected display can be controlled by the gaming application in combination with the user's movement, gaming apparatus 1800 creates a highly believable or "immersive" environment for these users.

Many other first person perspective simulations can also be created by gaming apparatus 1800, for such activities as 3D seismic geo-prospecting, spacewalk planning, jungle canopy exploration, automobile safety instruction, medical education, etc. Tactile interface 1844 may provide a variety of output signals, such as recoil, vibration, shake, rumble, etc. Tactile interface 1844 may also include a touch-sensitive input feature, such as a touch sensitive display screen or a display screen that requires a stylus. Additional tactile interfaces, for example, input and/or output features for a motion sensitive probe are also included in various embodiments of the present invention.

Gaming apparatus 1800 may also include audio output devices, such as integrated audio speakers, remote speakers, or headphones. These sorts of audio output devices may be connected to gaming apparatus 1800 with wires or through a wireless technology. For example, wireless headphones 1846 provide the user with sound effects via a Bluetooth connection, although any sort of similar wireless technology could be substituted freely. In some embodiments, wireless headphones 1846 may include microphone 1845 or binaural microphone 1847, to allow multiple users, instructors, or observers to communicate. Binaural microphone 1847 typically includes microphones on each ear piece, to capture sounds modified by the user's head shadow. This feature may be used for binaural hearing and sound localization by other simulation participants.

Gaming apparatus 1800 may include any number of sensors 1810 that measure distance, ambient brightness, motion, position, orientation, and the like. For example, gaming apparatus 1800 may detect absolute heading with a digital compass, and detect relative motion with an x-y-z gyroscope or accelerometer. In some embodiments, gaming apparatus 1800 also includes a second accelerometer or gyroscope to detect the relative orientation of the device, or its rapid acceleration or deceleration. In other embodiments, gaming apparatus 1800 may include a Global Positioning Satellite (GPS) sensor, to detect absolute position as the user travels in terrestrial space.

Gaming apparatus 1800 may include battery 1841 and/or diagnostic lights 1843. For example, battery 1841 may be a rechargeable battery, and diagnostic lights 1843 could indicate the current charge of the battery. In another example, battery 1841 may be a removable battery clip, and gaming apparatus 1800 may have an additional battery, electrical capacitor or super-capacitor to allow for continued operation of the apparatus while the discharged battery is replaced with a charged battery. In other embodiments, diagnostic lights 1843 can inform the user or a service technician about the status of the electronic components included within or connected to this device. For example, diagnostic lights 1843 may indicate the strength of a received wireless signal, or the presence or absence of a memory card. Diagnostic lights 1843 could also be replaced by any small screen, such as an organic light emitting diode or liquid crystal display screen. Such lights or screens could be on the exterior surface of gaming apparatus 1800, or below the surface, if the shell for this apparatus is translucent or transparent.

Other components of gaming apparatus 1800 may be removable, detachable or separable from this device. For example, the projection apparatus may be detachable or separable from gaming housing 1849. In some embodiments, the subcomponents of the projection apparatus may be detachable or separable from gaming housing 1849, and still function.

Although the present invention has been described in conjunction with certain embodiments, it is to be understood that modifications and variations may be resorted to without departing from the scope of the invention as those skilled in the art readily understand. Such modifications and variations are considered to be within the scope of the invention and the appended claims.

What is claimed is:

1. A piezoelectric actuated device comprising:
   a frame;
   a platform that can take on different angular displacements relative to the frame;
   at least one flexure coupling the platform to the frame; and
   piezoelectric material mechanically coupled to at least a portion of the frame, wherein the piezoelectric material has a non-uniform area density, wherein the device exhibits a desired structural Eigenmode of vibration that results in stress on the frame, and the non-uniform area density is related to the stress.

2. The piezoelectric actuated device of claim 1 wherein the area density is greater in areas of greater stress.

3. A piezoelectric actuated device comprising:
   a frame;
   a platform that can take on different angular displacements relative to the frame;
   at least one flexure coupling the platform to the frame; and
   piezoelectric material mechanically coupled to at least a portion of the frame, wherein the piezoelectric material has a non-uniform area density, wherein a plurality of areas of piezoelectric material are mechanically coupled to the frame, and wherein at least two of the plurality of areas of piezoelectric material have common electrical connections.

4. A piezoelectric actuated device comprising:
   a frame;
   a platform that can take on different angular displacements relative to the frame;
   at least one flexure coupling the platform to the frame; and
   piezoelectric material mechanically coupled to at least a portion of the frame, wherein the piezoelectric material has a non-uniform area density, wherein the piezoelectric material has a non-uniform thickness.

5. A piezoelectric actuated device comprising:
   a frame;
   a platform that can take on different angular displacements relative to the frame;
   at least one flexure coupling the platform to the frame, wherein the device exhibits a desired structural Eigenmode of vibration that results in stress on the frame; and
   piezoelectric material mechanically coupled to at least a portion of the frame, wherein the piezoelectric material is coupled to areas of greatest stress for the desired structural Eigenmode of vibration, wherein a plurality of areas of piezoelectric material are mechanically coupled to the frame, and wherein at least two of the plurality of areas of piezoelectric material have common electrical connections.

6. A method comprising:
   depositing piezoelectric material on a frame coupled to a resonant scanning mirror; and
   etching portions of the piezoelectric material to yield a non-uniform area density of piezoelectric material on the frame, wherein the non-uniform area density is related to stress exhibited by the frame in a desired Eigenmode.

7. A method comprising:
   depositing piezoelectric material on a frame coupled to a resonant scanning mirror;
   etching portions of the piezoelectric material to yield a non-uniform area density of piezoelectric material on the frame, wherein etching comprises etching to create multiple separate areas of piezoelectric material with non-uniform area density, and electrically connecting the multiple areas in common.

8. A method comprising:

depositing piezoelectric material on a frame coupled to a resonant scanning mirror;

etching portions of the piezoelectric material to yield a non-uniform area density of piezoelectric material on the frame, wherein etching comprises etching to create multiple separate areas of piezoelectric material with non-uniform area density, and electrically connecting a subset of the multiple areas in common.

9. A projection device comprising:

at least one laser light source; and a piezoelectric actuated resonant scanning mirror assembly to reflect light from the at least one laser light source, wherein the resonant scanning mirror assembly includes a frame with piezoelectric material having a non-uniform area density, wherein the piezoelectric material has a non-uniform thickness.

* * * * *